United States Patent [19]

Goto et al.

[11] Patent Number: 4,916,335

[45] Date of Patent: Apr. 10, 1990

[54] SUPERCONDUCTING CIRCUIT

[75] Inventors: Eiichi Goto, Fujisawa; Yutaka Harada, 2196-416 Hirai, Hinodemachi, Nishitama-gun, Tokyo, both of Japan

[73] Assignees: L. Research Development Corporation of Japan; Yutaka Harada, both of Tokyo, Japan; a part interest

[21] Appl. No.: 242,210

[22] Filed: Sep. 9, 1988

[30] Foreign Application Priority Data

Sep. 9, 1987 [JP] Japan .................................. 62-226202

[51] Int. Cl.$^4$ ..................... H03K 17/92; H03K 19/195
[52] U.S. Cl. ................................. 307/306; 307/245; 307/277; 307/462; 505/861; 505/865
[58] Field of Search ............. 307/462, 306, 245, 277, 307/403, 476; 357/5; 505/859, 860, 861, 864, 865

[56] References Cited

U.S. PATENT DOCUMENTS 4,117,503  9/1978  Zappe .................................. 307/306
4,785,426  11/1988  Harada et al. ....................... 307/306

OTHER PUBLICATIONS

IBM TDB, vol. 20, No. 12, May 1978, pp. 5404–5406, "Josephson Latch" S. M. Faris.
P. Gueret, "New Type of Single Flux Quantum Cell with Large Margins", IBM TDB, vol. 21, No. 6, Nov. 1978, pp. 2534–2535.
"Superconducting A/D Converter Using Latching Comparators", by C. A. Hamilton et al., IEEE Trans. Magnetics, vol. MAG-21, No. 2, Mar. 1985, pp. 197–199.
"A High-Speed Analog-to-Digital Converter Using Josephson Self-Gating-AND Comparators", by D. A. Petersen et al., IEEE Trans. Magnetics, vol. MAG-21, No. 2, Mar. 1985, pp. 200–203.
"Regulated AC Power for Josephson Interferometer Latching Logic Circuit", IEEE Transaction on Magnetics, by P. C. Arnett et al., vol. MAG-15, No. 1, pp. 554–557 (1979).
"Analysis of Flux Input and Output Josephson Pair Device", IEEE Trans., by K. Loe et al., MAG-21, No. 2, pp. 884–887 (Mar. 1985).

*Primary Examiner*—John Zazworsky
*Attorney, Agent, or Firm*—Fleit, Jacobson, Cohn, Price, Holman & Stern

[57] ABSTRACT

There is provided a quantum flux parametron-type superconducting circuit in which a path with a Josephson device is connected in parallel with exciting inductors of the quantum flux parametron or inductors of exciting line magnetically coupled with the exciting inductors, thereby constructing a phase regulator.

6 Claims, 20 Drawing Sheets

3 PHASE BIPOLAR EXCITATION

3 PHASE UNIPOLAR EXCITATION
(OFFSET CURRENT IS APPLIED)

SUPERCONDUCTING CIRCUIT

FIELD OF THE INVENTION

This invention relates to a superconducting circuit using Josephson devices, and especially relates to a superconducting circuit which has a broad operational margin.

DESCRIPTION OF THE PRIOR ART

The quantum flux parametron is a parametron-type superconducting switching circuit which uses Josephson devices exhibiting the Josephson effects. In the quantum flux parametron, a dc magnetic flux quantum is used as a signal medium and the operation is based on a new concept. The quantum flux parametron is extremely adequate for computer elements because the quantum flux parametron operates in a very high speed, consuming less power. The quantum flux parametron also has very good qualities as an analog circuit such as a magnetic flux sensor because the quantum flux parametron can amplify very weak magnetic flux in a high gain.

Since a quantum magnetic flux device including the quantum flux parametron is a superconducting device based on a new concept, it will be better to explain its operation by use of the generalized magnetic flux and the generalized phase.

Characteristic features of the superconducting circuits including the quantum magnetic flux device are as follows:

1. In the superconducting circuits, voltages generated by principal elements in a stable condition are zero, so that it is obvious that "The Kirchhoff's second law (The algebraic sum of the voltage drops along a closed loop is zero)", which determines operation of the circuits, is satisfied.

2. The quantity of the fluxoid in the superconducting loop is equal to an integer multiple of the quantum magnetic flux ($2.07 \times 10^{-15}$ wb). This phenomenon is called "The law of fluxoid quantization" and also determines operation of the circuits.

FIGS. 2A and 2B show an inductor and a Josephson device, respectively, which are essentially circuit elements used in the quantum flux parametron. Hereinbelow, we will introduce new circuit parameters, that is, the generalized magnetic flux and the generalized phase in conjunction with the two elements.

The relation between voltage v and current i across the inductor with inductance L shown in FIG. 2A is represented by Eq. (1)

$$v = L(di/dt) \qquad (1)$$

By integrating Eq. (1) with time, we obtain Eq. (1').

$$\int v\, dt = Li \qquad (1')$$

The time integration of voltage $\int v\, dt$ in Eq. (1') corresponds to magnetic flux through the inductor. In order to expand the concept and the utility of the magnetic flux, we will introduce the generalized magnetic flux $\Phi$, which is redefined by Eq. (1").

$$\Phi = \int v\, dt \qquad (1'')$$

On the other hand, the characteristic equations of the Josephson device shown in FIG. 2B are represented by Eqs. (2a) and (2b)

$$i = Im \cdot \sin \phi \qquad (2a)$$

$$v = \hbar/2e (d\phi/dt) \qquad (2b)$$

Where, Im is a critical current of the Josephson device, $\phi$ is a phase angle of the Josephson device, $\hbar$ is normalized Planck's constant, and e is the charge on the electron. The magnetic flux quantum $\Phi_o$ is represented by Eq. (3).

$$\Phi_o = h/2e \qquad (3)$$

By integrating Eq. (2b) with time and using the generalized magnetic flux $\Phi$ introduced in Eq. (1''), Eq. (4) is established as follows.

$$\Phi = \Phi_o \cdot \phi / 2\pi \qquad (4)$$

This Eq. (4) shows that the phase angle $\phi$ of the Josephson device can be represented by the generalized magnetic flux $\Phi$.

Hence, we redefine the phase $\phi$ in Eq. (4) as the generalized phase $\phi$, which is directly defined by the following Eq. (4').

$$\phi = 2\pi \Phi / \Phi_o \qquad (4')$$

From the above description, it is found that the superconducting circuit including the Josephson device can be represented by the generalized magnetic flux or the generalized phase. It is obvious that once "the law of fluxoid quantization" is satisfied in an initial state of the circuit, the circuit fulfilling the Kirchhoff's first and second laws will retain "the law of fluxoid quantization". In an initial state, if current, voltage, the generalized phase and the generalized magnetic flux are all zero, it is obvious that the circuit is satisfying "the law of fluxoid quantization". Therefore, we will assume that current, voltage, the generalized phase and the generalized magnetic flux are all zero in initial states of the circuits which will be explained hereinbelow.

Next, we will explain the problems of the prior art quantum flux parametron.

FIG. 3 is a circuit diagram of a prior art quantum flux parametron. The quantum flux parametron comprises a superconducting loop 15 having two Josephson devices 10 and 11 and two exciting inductors 12 and 13. Near the superconducting loop 15, exciting line 20 is disposed, and inductors 12' and 13' of the exciting line 20 is magnetically coupled with the exciting inductors 12 and 13 of the superconducting loop 15. The quantum flux parametron is excited by supplying exciting current through the exciting line 20. An input signal is provided to the quantum flux parametron through a line 16 and then an output signal appears at a load inductor 14 connected to the superconducting loop 15 between the exciting inductors 12 and 13. When this circuit is excited after the input signal becomes stable, an output signal, which is amplified in proportion to the input signal, is obtained from the load inductor 14. In the quantum flux parametron, the term "exciting" denotes that the generalized phases of the exciting inductors 12 and 13 become about $\pi$, respectively, due to application of magnetic flux to the parametron.

FIG. 4 shows the relation between the exciting phase and the output current in the case that the quantity of the input magnetic flux is 5% of that of the magnetic flux quantum. In FIG. 4, the largest current flows when the exciting phase is $\pi$, but the output current rapidly decreases when the exciting phase becomes less than 0.6$\pi$ or larger than 1.4$\pi$. This means that the suitable exciting current range for the quantum flux parametron resides between ±40% of $\pi$. The exciting current range depends on the intensity of the input signal, that is, the smaller the input signal is, the narrower the exciting current range is. For example, if the input signal is zero, the suitable exciting current range is ±10% at most. This exciting current range determines the operational margin of the quantum flux parametron.

The quantum flux parametron is a two terminal network. Therefore, in order to determine the direction of signal propagation, a three phase alternating current source, in which current phases are different by 60°, is to be used to supply the exciting currents. Additionally, it is possible to drive the quantum flux parametron by use of a more than three polyphase alternating current source. The following explanation will be made concerning the case that the basic three phase alternating current source is used, but a similar explanation may be made with regard to a more than three polyphase alternating current source. In the three phase exciting method, signals are transmitted from one quantum flux parametron to another while those exciting currents of different phases are overlapped. In this exciting method, it is obvious that the larger the overlapped portion between the exciting currents of two different phases is, the more stable the signal transmission is. In order to drive the quantum flux parametron at a high frequency, for example, 10 GHz, the exciting currents are preferably sinusoidal waves. FIGS. 5A and 5B show the overlap of the exciting currents when the exciting currents are the sinusoidal waves. If the exciting is caused by the bipolar sinusoidal waves shown in FIG. 5A, the exciting current overlap each other only where the intensity of the exciting current is less than 71% of the maximum intensity because the phases are different by 60°. If the excitation is caused by the unipolar sinusoidal waves shown in FIG. 5B, the exciting currents overlap only where the intensity of the exciting current is less than 75% of the maximum intensity because the phases are different by 120°. Therefore, if the exciting phases are $\pi$ when the value of the exciting currents are maximum, the exciting phases, while the exciting currents overlap, almost exceed the above suitable range, so that the value of the output current is small. As a result, signal is not transmitted properly. Even if the signal is transmitted properly, the operational margin of the circuit is extremely narrow. And further, if the value of the exciting current is enlarged to increase the exciting current during the signal transmission, the excitation at the maximum current becomes too deep and according to the characteristics shown in FIG. 4 a dent is made on the waveform of the output current (see FIG. 10).

This dent on the output signal should be avoided because it will cause malfunctions. As described above, in the prior art quantum flux parametron, the effective overlapped portion between the exciting currents is small when the excitation is caused by the three phase sinusoidal waves, as a result, there is a fault that the operational margin is narrow.

In order to solve this problem, it has been considered to provide means for clipping the sinusoidal wave in or near the circuit to form a trapezoidal wave and supply the trapezoidal wave to the circuit. This idea is realized by a method disclosed in P. C. Arnett, D. J. Herrell, "REGULATED AC POWER FOR JOSEPHSON INTERFEROMETER LATCHING LOGIC CIRCUIT", IEEE TRANSACTION ON MAGNETICS, VOL. MAG-15, No. 1, PP. 554–557, (1979). The method disclosed there utilizes the non-linearity of voltage-current characteristics of the Josephson devices which are connected in serial to form a voltage regulator for a power source. However, in the method, consumed electric power is extemely large, for example, a regulator for 500 circuits needs up to 5 mW. In constrast, the power consumed in the quantum flux parametron is 1 nW/one and thus 1 mw/a million at most. It is therefore very disadvantageous to use the above mentioned voltage regulator for the quantum flux parametron consuming such low electric power and thus the above voltage regulator can not be used.

SUMMARY OF THE INVENTION

An object of this invention is to broaden the operational margin, especially to ensure that signal is properly transmitted between the quantum flux parametrons when the exitation is caused by polyphase sinusoidal exciting currents.

Another object of this invention is to operate logic and memory devices at a high speed and then to realize high-performance computers.

According to this invention, the above mentioned problems are solved by connecting a path including a Josephson device in parallel with the exciting inductor of the quantum flux parametron or the inductor of the exciting line magnetically coupled with said exciting inductor, thereby forming a phase regulator (a magnetic flux regulator) at the connecting portion.

In this invention, since the effective region of the exciting current is broadened due to the effect of the exciting current regulation, signals are properly transmitted by the polyphase sinusoidal alternating current source. Additionally, since rising of the exciting current is fast, influence of noise during the process of reaching to the excitation becomes smaller and then unstableness of the circuit due to the noise is removed. Furthermore, since the rising time is shortened, the quantum flux parametron can be operated at a high frequency. As a result, this invention is very effective to construct high speed and high stable processing systems.

Hereinbelow, we will explain several examples according to this invention in conjunction with the accompanying drawings.

EXAMPLES

Figure 6A:
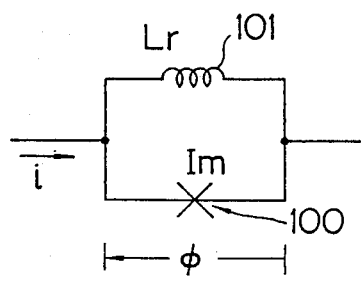
FIGS. 6A and 6B are circuit diagrams showing phase regulators used in this invention.
Figure 6B:
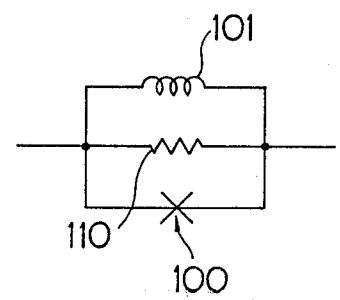

FIGS. 6A and 6B are examples of phase regulators used in this invention. A phase regulator shown in FIG. 6A is constructed by connecting a Josephson device 100 and an inductor 101 in parallel. Assuming that φ denotes phase across the Josephson device 100 and the inductor 101 and i denotes total current flowing through the Josephson device 100 and the inductor 101, we will obtain Eq. (5) from Eqs. (1') and (2a).

$$i = \phi \cdot \Phi_0/(2\pi Lr) + Im \cdot \sin \phi \quad (5)$$

Figure 7:
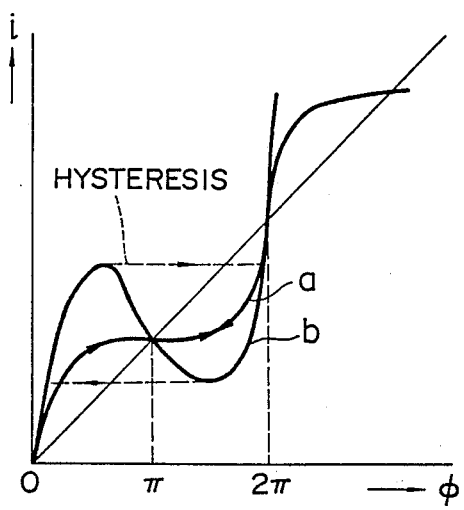
FIG. 7 is a graph showing the relation between the phase φ and the current i in the circuit of FIG. 6A.

In Eq. (5), Lr denotes the inductance of the inductor 101. The relation between the phase and the current represented by Eq. (5) is shown in FIG. 7. The characteristic which is sought for the phase regulator shown in FIG. 6A is small variance of the phase φ even if the current i largely varies. In FIG. 7, at an operating point where the phase φ is around $2\pi$, the variance of the phase is small while the current largely varies. From this phenomenon, the circuit shown in FIG. 6A is considered as a phase regulator circuit fixing the phase at $2\pi$. By differentiating Eq. (5) with the phase, we will obtain Eq. (6).

$$di/d\phi = \Phi_0/(2\pi Lr) + Im \cdot \cos \phi \quad (6)$$

By using Eq. (6), we can design the phase regulator shown in FIG. 6A. The value of Eq. (6) at the phase $\phi = \pi$ or $2\pi$ determines the characteristic of the phase regulator.

$$di/d\phi \Big|_{\phi = \pi} = \Phi_0/(2\pi Lr) - Im \quad (7a)$$

$$di/d\phi \Big|_{\phi = 2\pi} = \Phi_0/(2\pi Lr) + Im \quad (7b)$$

In order to improve the regulating effect of the phase regulator, the gradient represented by Eq. (7b) should be increased. This can be carried out by increasing the critical current of the Josephson device or reducing the inductance of the Josephson device. However, as you will see from Eq. (7b), the gradient will never become infinite whatever parameters of the elements are chosen. On the other hand, in the quantum flux parametron, since the faster the rising of the exciting current is, the less the influence of the noise from the outside is, thus faster rising of the exciting current is preferable for circuit operation. In FIG. 7, the value of the gradient at the phase $\phi = \pi$ represents the speed of rising of the exciting current. If the critical current Im of the Josephson device is set as $\Phi_0/(2\pi Lr)$, the gradient at the phase $\phi = \pi$ becomes zero from Eq. (7a), and then as shown by the characteristic curve "a" in FIG. 7, a very swift rising can be realized. Further, if the critical current is larger than $\Phi_0/(2\pi Lr)$, the characteristics are represented by the curve "b" in FIG. 7 and then hysteresis occurs as shown by the dotted lines. In this case, the rising of the exciting current becomes much faster due to the jumping of the phase. Additionally, the values of the current at the points of rising and falling are different from each other. These characteristics can be used to delay the exciting time. Since the phase regulator shown in FIG. 6A forms a superconducting loop with the inductor 101 and the Josephson device 100, it is useful to insert a damping resistor 110 as shown in FIG. 6B in order to damp the resonance which will be caused in the loop.

Figure 1:
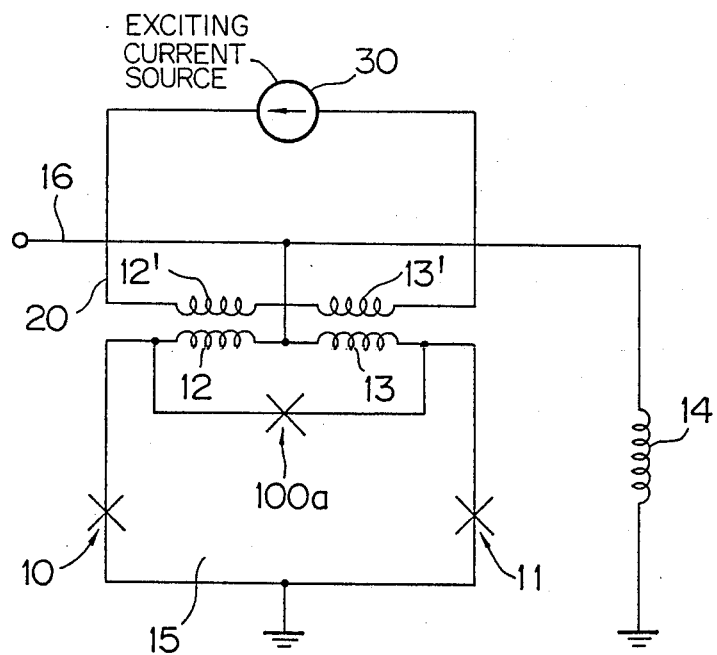
FIG. 1 is a circuit diagram of a first example of this invention.
Figure 2A:
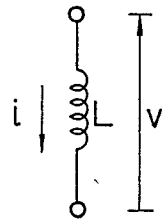
FIGS. 2A and 2B are symbols of an inductor and a Josephson device, respectively, which are essential circuit elements of the quantum flux parametron.
Figure 2B:
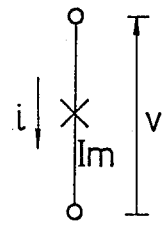
Figure 8:
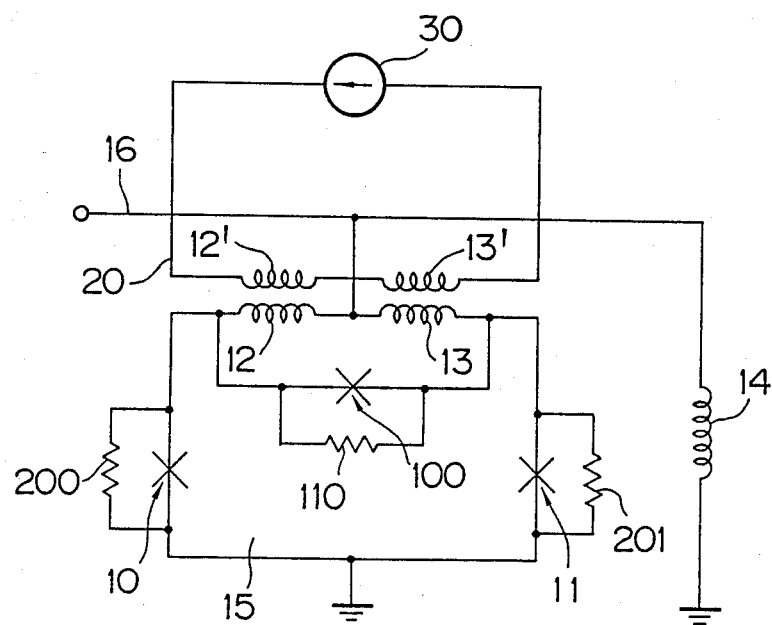
FIG. 8 is a circuit diagram in which damping resistors are provided to the first example shown in FIG. 1, FIGS. 9 and 10 are graphs showing the relation between the exciting current and the output signal current in the prior art quantum flux parametron shown in FIG. 3, FIGS. 11 to 13 are graphs showing the relation between exciting current and output signal current in this invention employing the phase regulator.

FIG. 1 is a circuit diagram of a first example of this invention. In the example of FIG. 1, a Josephson device 100a is connected in parallel with the exciting inductors 12 and 13 of the prior art quantum flux parametron shown in FIG. 3 to provide a faculty of a phase regulator. In this circuit construction, the exciting inductors 12 and 13 correspond to the inductor 101 shown in FIG. 6A. To excite the quantum flux parametron is the same as to set each phase across the exciting inductor 12 or 13 at π. Accordingly, during excitation, phase difference across the exciting inductors 12 and 13, which are connected in serial, is $2\pi$ in total. The circuit shown in FIG. 6A is the phase regulator clamping the phase at $2\pi$. This regulator is introduced into the quantum flux parametron. The exciting current is supplied from the source 30. The circuit shown in FIG. 1 includes a superconducting loop. In order to damp the resonance of the superconducting loop, it is preferable to insert damping registors 200, 201 and 110 as shown in FIG. 8.

Figure 5A:
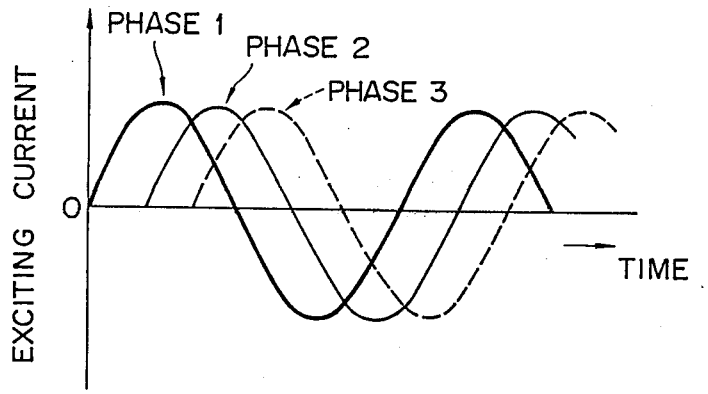
FIGS. 5A and 5B are graphs showing the overlapping of the exciting currents in the case that three phase sinusoidal waves are used.
Figure 5B:
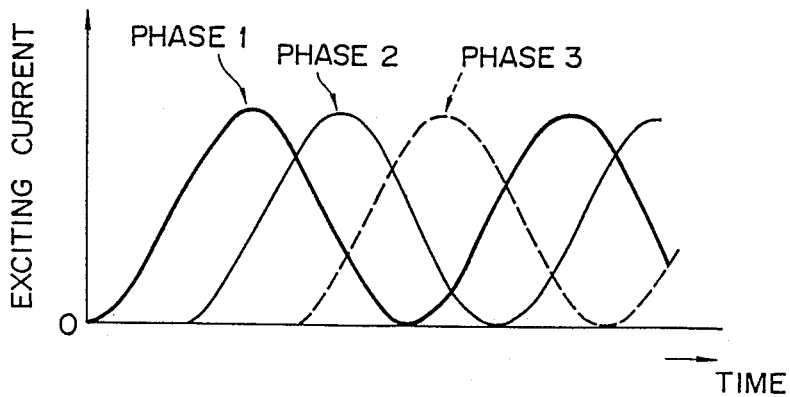
Figure 9:
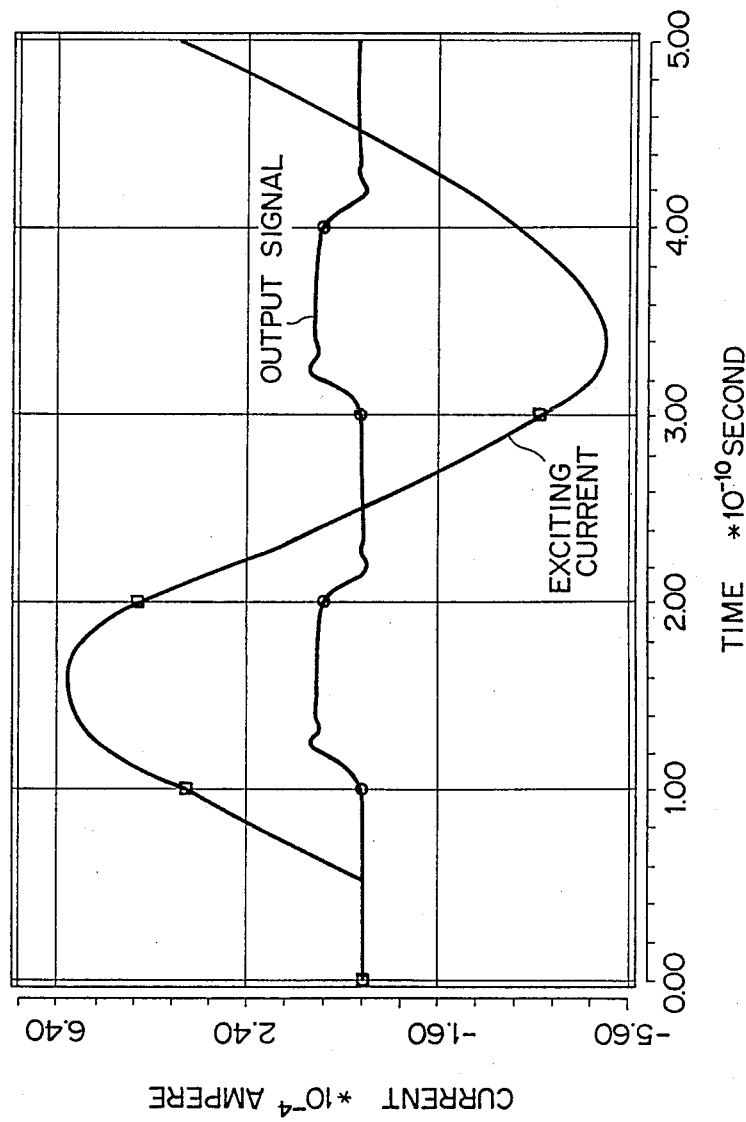
Figure 10:
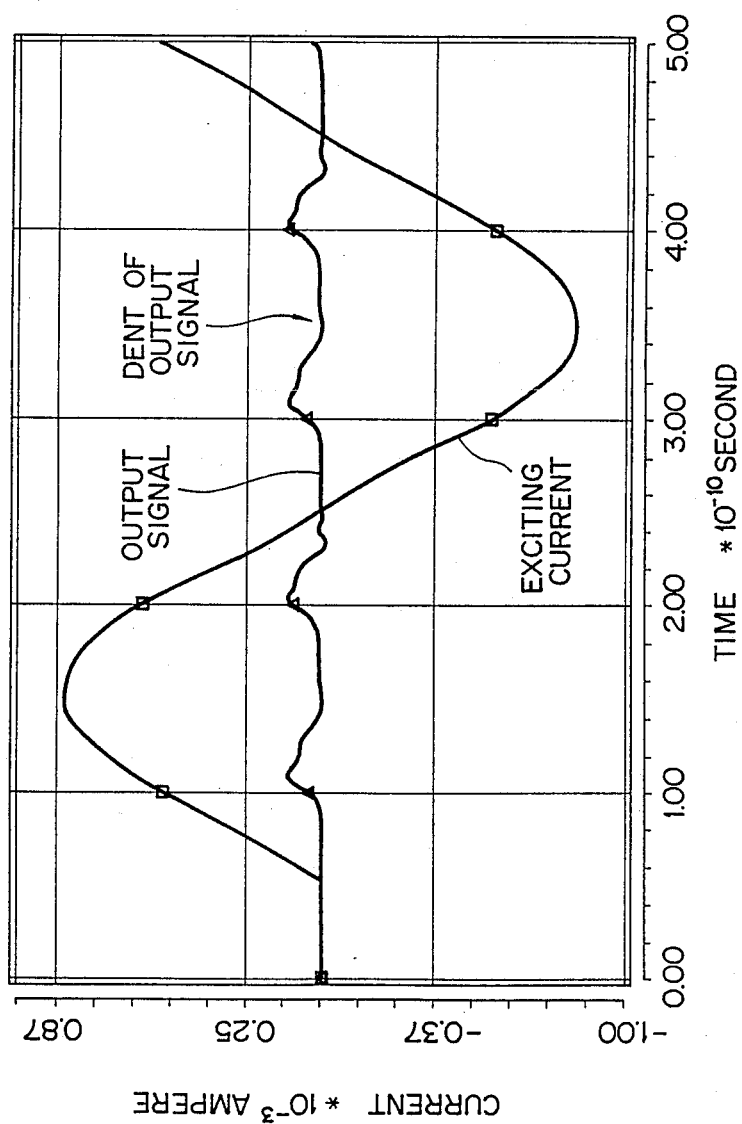

FIGS. 9 to 13 are results of circuit simulations, which were carried out to investigate this invention. In these simulations, the bipolar sinusoidal current shown in FIG. 5A is provided from the current source to supply the exciting current, the critical currents of the Josephson devices are 50 μA and the exciting inductance is 5 pH. FIGS. 9 and 10 show results in the case that the phase regulator is not employed, that is, in the case of FIG. 3. In the case of FIG. 9, the exciting current is set so that the exciting phase is just $\pi$ at the maximum exciting current. From FIG. 9, it is found that effective region of the exciting current is at most 50%. If the exciting current is increased so as to expand the effective region, a dent is made on the output current waveform as shown in FIG. 10.

Figure 11:
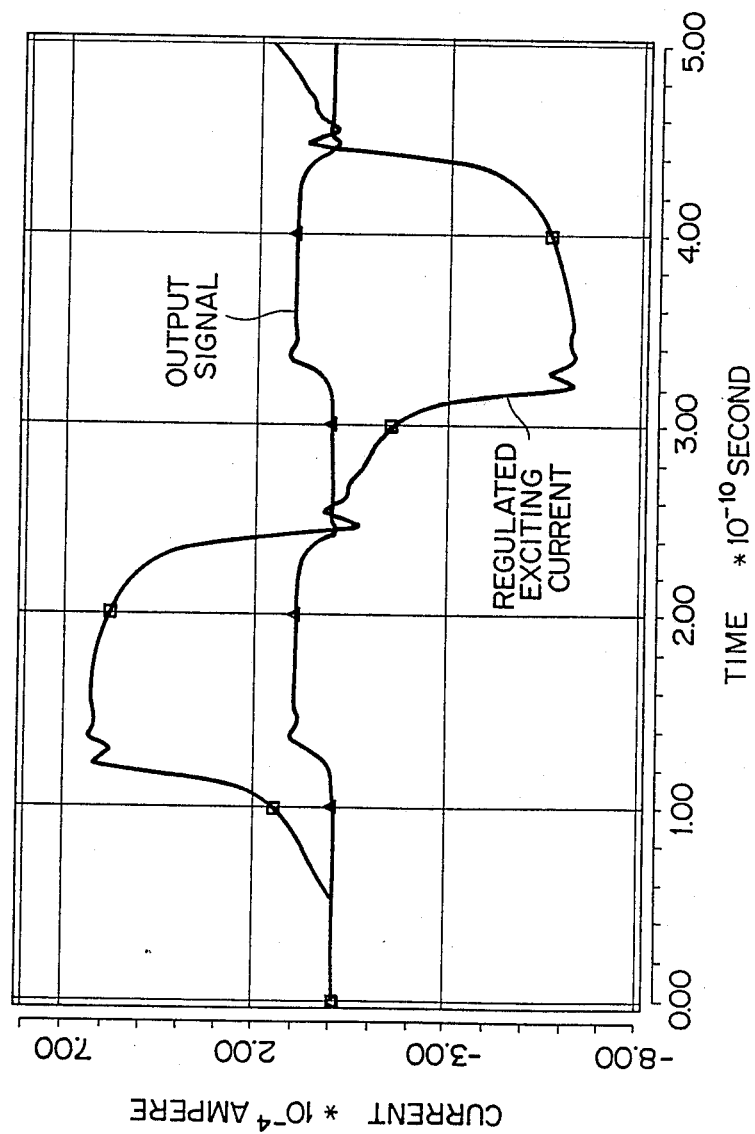
Figure 12:
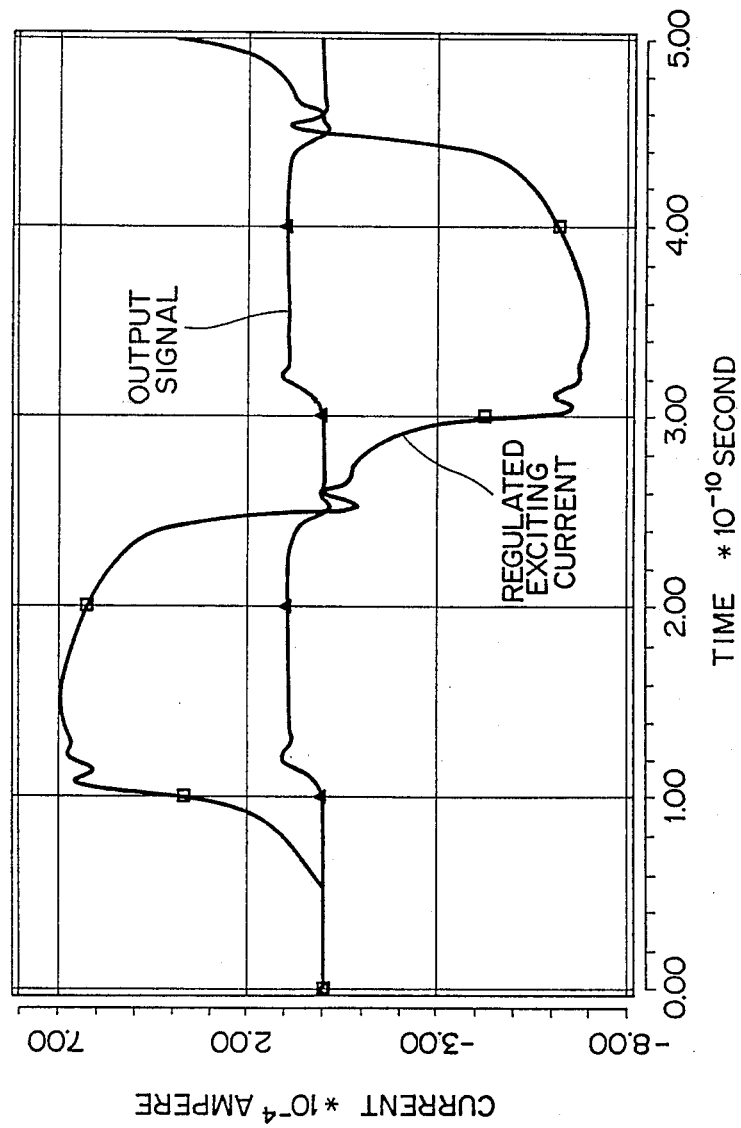
Figure 13:
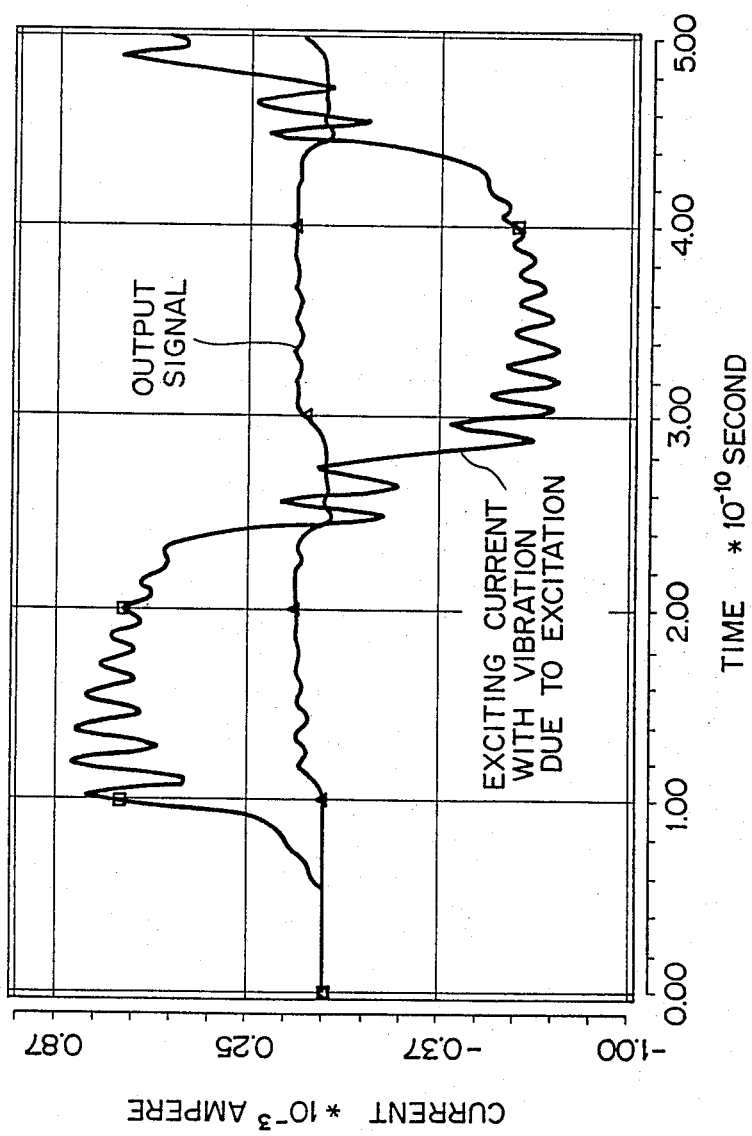

FIGS. 11, 12 and 13 show results in the case that the phase regulator is employed according to this invention. A phase regulator is constructed by connecting the Josephson device 100a having a critical current of 200 $\mu$A in parallel with the exciting inductors 12 and 13. If the circuit parameters are selected as above, the gradient represented by Eq. (7a) becomes negative at phase $\pi$, and the characteristics of the phase regulation has hysteresis, as a result, the quantum flux parametron can be excited quite rapidly. In FIGS. 11 and 12, the damping resistor 110=2$\Omega$ was used. The condition of the exciting current in the case of FIG. 11 is the same as that in the case of FIG. 9. In the case of FIG. 11, due to the hysteresis the effective region for the excitation is expanded on the falling side of the pulse as compared to the case of FIG. 9, so that the duration of the output signal is prolonged. The conditions of the exciting current of FIG. 12 is the same as that in the case of FIG. 10. In the case of FIG. 12, because of the phase regulator, the exciting phase is clipped at $2\pi$ and a dent is not made on the output signal wave though the exciting current is increased. Accordingly, the effective region of the exciting current is expanded and the duration of the output signal is prolonged. As a result, the signal transmission under the polyphase excitation becomes easy.

FIG. 13 shows the result in the same condition as that of FIG. 12 except the damping resistor 110 is removed. The exciting current vibrates due to resonance. This vibration may cause malfunctions. Therefore, the insertion of the damping resistor 110 is important to stabilize the circuit operation. FIGS. 9 to 13 show the case that the quantum flux parametrons are driven with the bipolar alternating currents. Alternatively, if the unipolar alternating currents are used, the operational margin becomes broader. This unipolar alternating current waveform can be generated by adding a direct current to a sinusoidal wave. In the unipolar excitation, the efficiency of the exciting current regulation is higher than that in the bipolar excitation, and the operation margin becomes broader.

Figure 14:
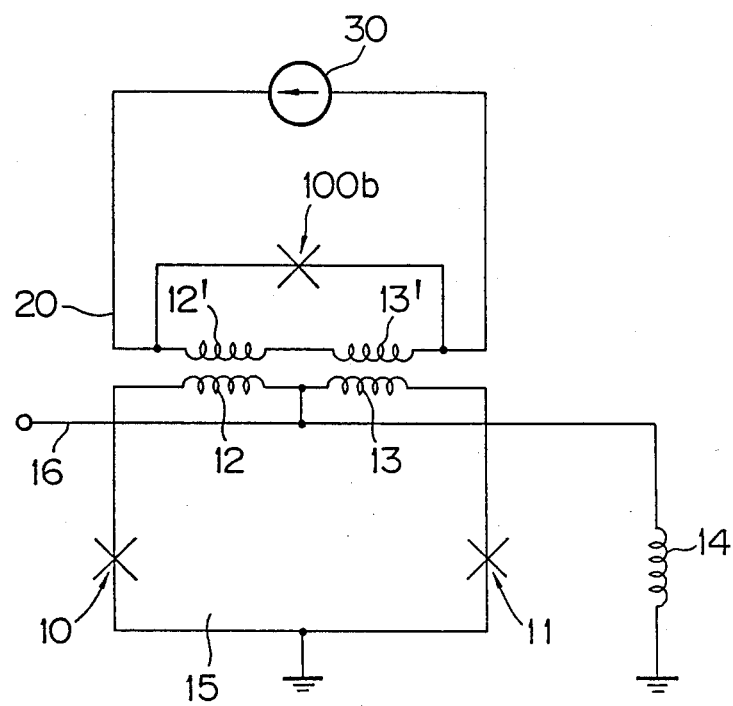
FIG. 14 is a circuit diagram of a second example of this invention.
Figure 15:
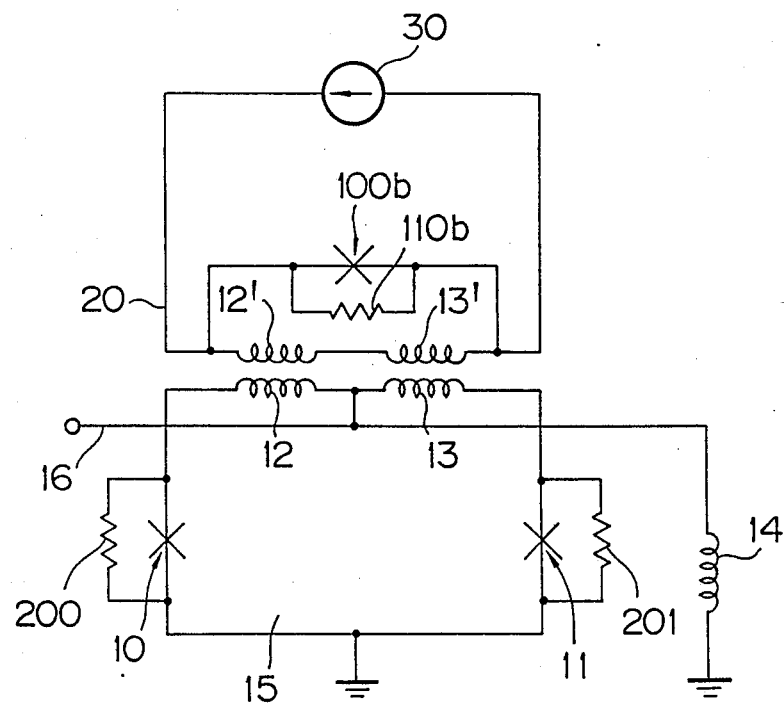
FIG. 15 is a circuit diagram in which damping resistors are provided to the example shown in FIG. 14, FIGS. 16A and 16B are circuit diagrams of constant phase generators used in another example of this invention.

FIG. 14 shows a second example of this invention. In this example, a phase regulator is constructed by connecting a Josephson device 100b in parallel with the inductors 12' and 13' on the side of the exciting line 20. In this construction, the regulation is caused in a similar way as the case of FIG. 1. FIG. 15 shows an example in which damping resistors 110b, 200 and 201 are inserted in order to damp the resonance of the circuit shown in FIG. 14.

Figure 16A:
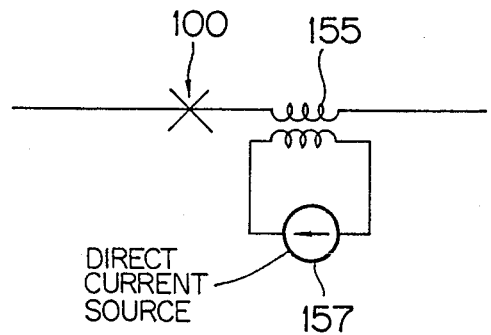
Figure 16B:
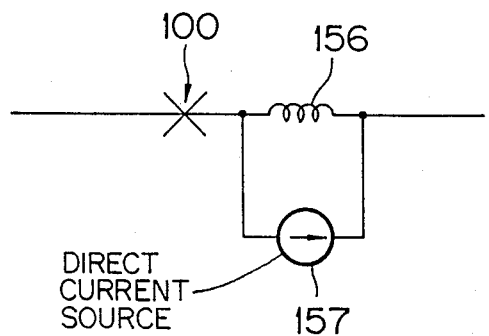

FIGS. 16A and 16B show constant generators used in another example of this invention. In FIG. 16A, the Josephson device 100 is connected to a winding of a transformer 155 in serial and a direct current source 157 supplies direct current to another winding of the transformer 155. Magnetic flux generated by the direct current produces a constant phase as an offset bias to the Josephson device 100. In FIG. 16B, the Josephson device 100 is connected with an inductor 156 in serial and a direct current source 157 supplies direct current to the inductor 156. In this circuit, magnetic flux generated by the direct current also produces a constant phase same as in the circuit of FIG. 16A.

Figure 17:
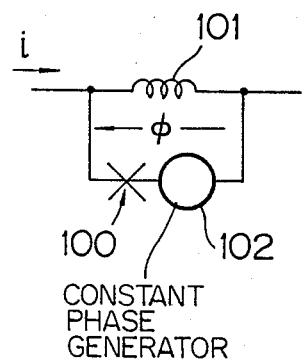
FIG. 17 is a circuit diagram of another phase regulator used in this invention.

FIG. 17 shows another phase regulator for use in this invention. This phase regulator is constructed by connecting the circuit shown in FIG. 16A or 16B with the inductor 101 in parallel. The circuit for generating a constant phase shown in FIG. 16A or 16B is represented by a constant phase generator 102. The relation between phase and current in the case of FIG. 17 will be described below.

If the phase of the constant phase generator 102 is set as $\pi$ or $-\pi$, the current i is represented by Eq. (8)

$$i = \phi \cdot \Phi_o/(2\pi Lr) + Im \cdot \sin(\phi \pm \pi)$$

$$i = \phi \cdot \Phi_o/(2\pi Lr) - Im \cdot \sin(\pi) \qquad (8)$$

Figure 18:
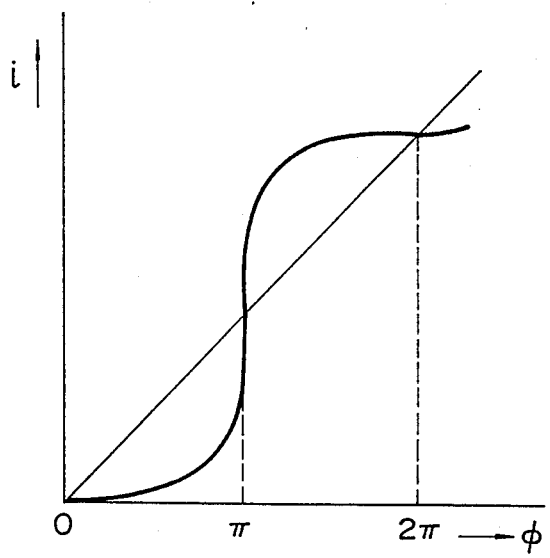
FIG. 18 is a graph showing the relation between the phase φ and the current i in the circuit of FIG. 17.

The relation between the phase $\phi$ and the current i of Eq. (8) is shown in FIG. 18. In FIG. 18, at the operating point where the phase $\phi$ is around $\pi$, variance of the phase $\phi$ is small when the current largely varies. From this phenomenon, the circuit shown in FIG. 17 is considered as a phase regulator which regulates the phase at $\pi$.

Figure 3:
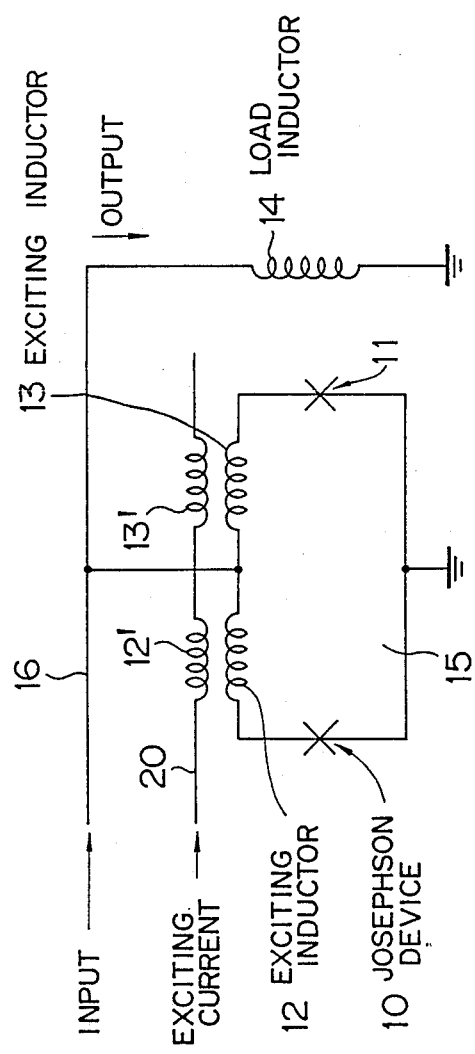
FIG. 3 is a circuit diagram of a prior art quantum flux parametron.
Figure 4:
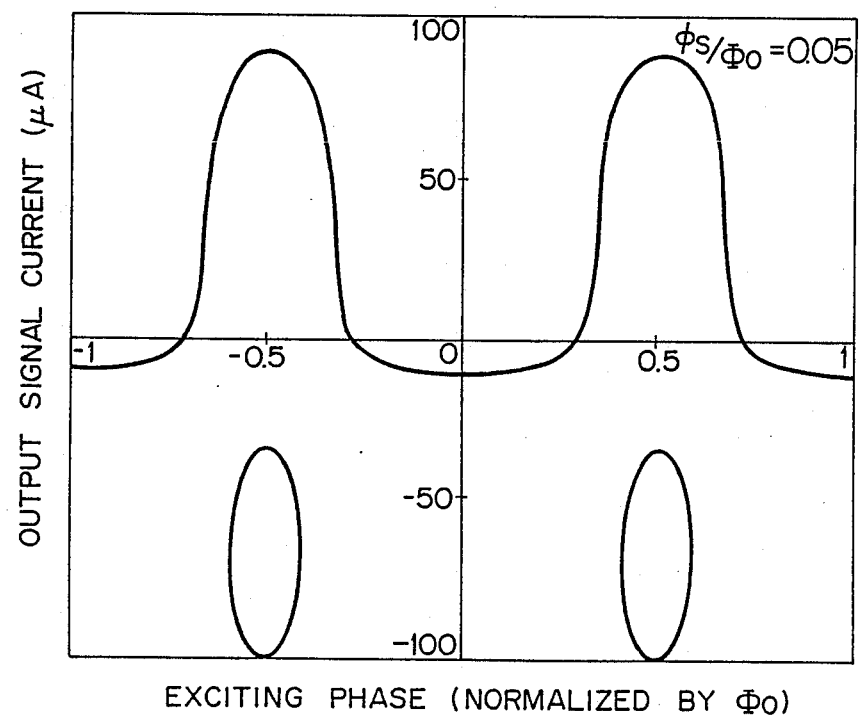
FIG. 4 is a graph showing the relation between the exciting phase and the output current in the case that input magnetic flux is 5% of the magnetic flux quantum.
Figure 19:
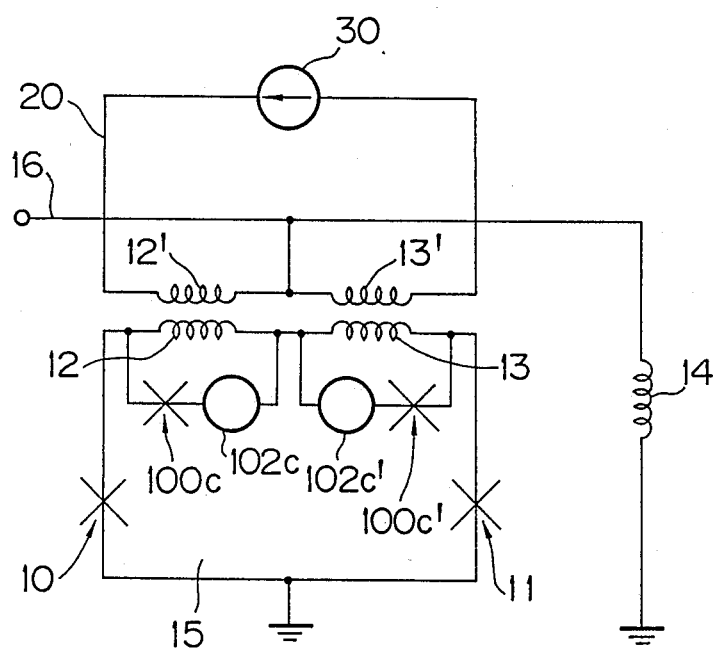
FIG. 19 is a circuit diagram of a third example of this invention using the phase regulator shown in FIG. 17.

FIG. 19 is a third example of this invetion using the phase regulator shown in FIG. 17. In the example of FIG. 19, the exciting inductor 12 of the prior art quantum flux parametron shown in FIG. 3 is connected in parallel with a series connection of a Josephson device 100c and a constant phase generator 102c, and the exciting inductor 13 is connected in parallel with a series connection of a Josephson device 100c' *and a constant phase generator 102c'*, whereby each exciting inductor has the faculty of the $\pi$ phase regulator. In this circuit arrangement, the exciting inductors 12 and 13 correspond to the inductor 101 shown in FIG. 17. The excitation of the quantum flux parametron is the same state as each phase of the exciting inductor is $\pi$. The phase regulator shown in FIG. 17 has the faculty of regulating the phase at $\pi$. Therefore, the example of FIG. 19 broadens the effective range of the exciting current in a similar way as the example of FIG. 1.

Figure 20:
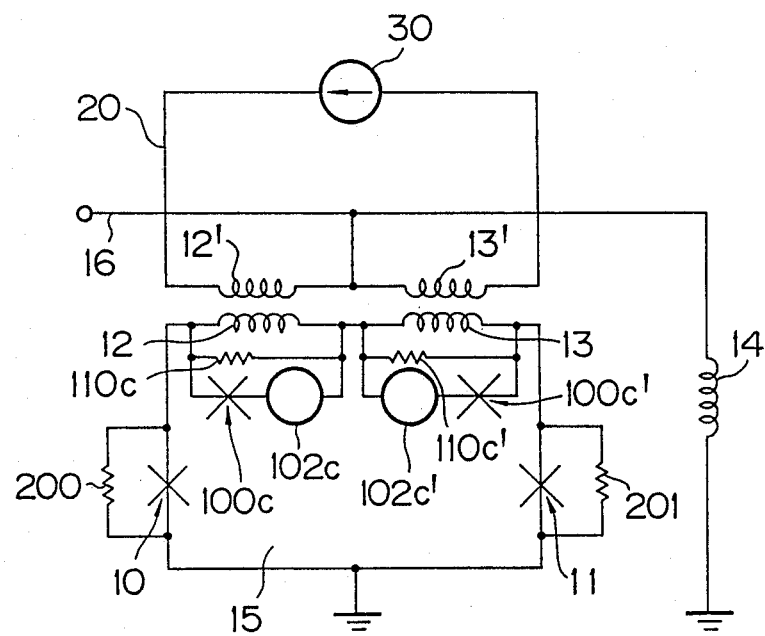
FIG. 20 is a circuit diagram in which damping resistors are provided to the example shown in FIG. 19.

FIG. 20 shows means for damping the vibration due to the resonance to ensure the operation of the circuit shown in FIG. 19. The exciting inductors 12 and 13 are connected in parallel with damping resistors 110c and 110c', respectively, and the Josephson devices 10 and 11 are connected with damping resistors 200 and 201, respectively.

Figure 21:
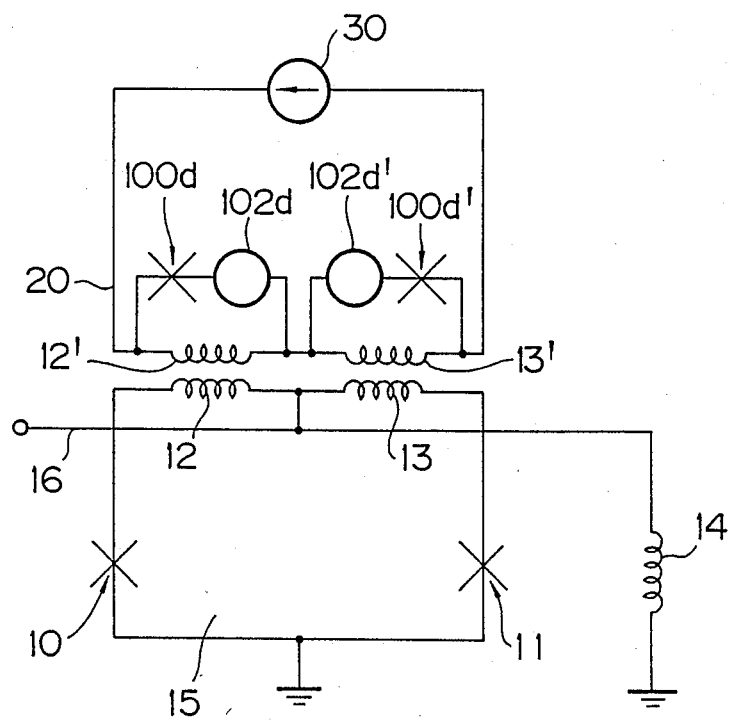
FIG. 21 is a circuit diagram of a fourth example of this invention in which phase regulators are formed on the respective inductors of the exciting line.
Figure 22:
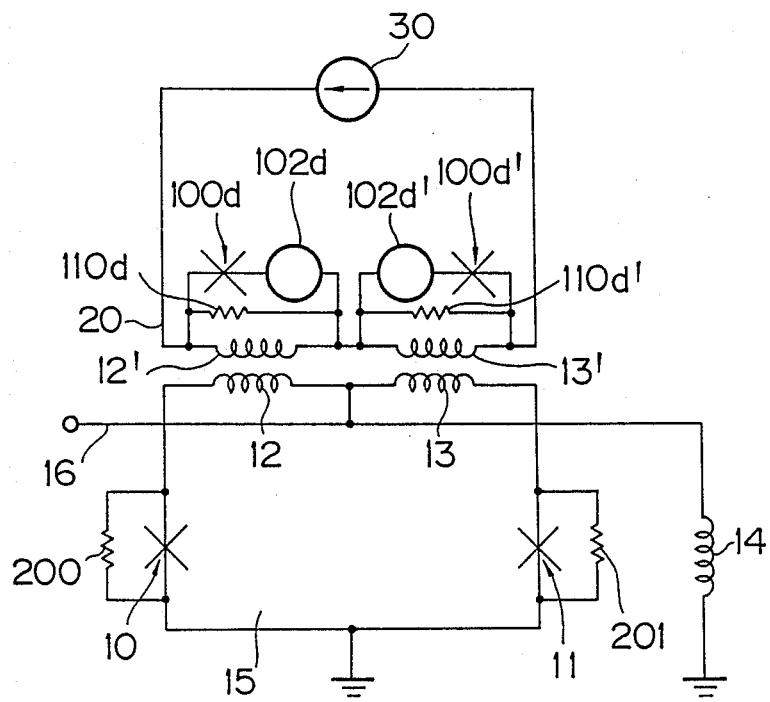
FIG. 22 is a circuit diagram in which damping resistors are provided to the example shown in FIG. 21.
Figure 23:
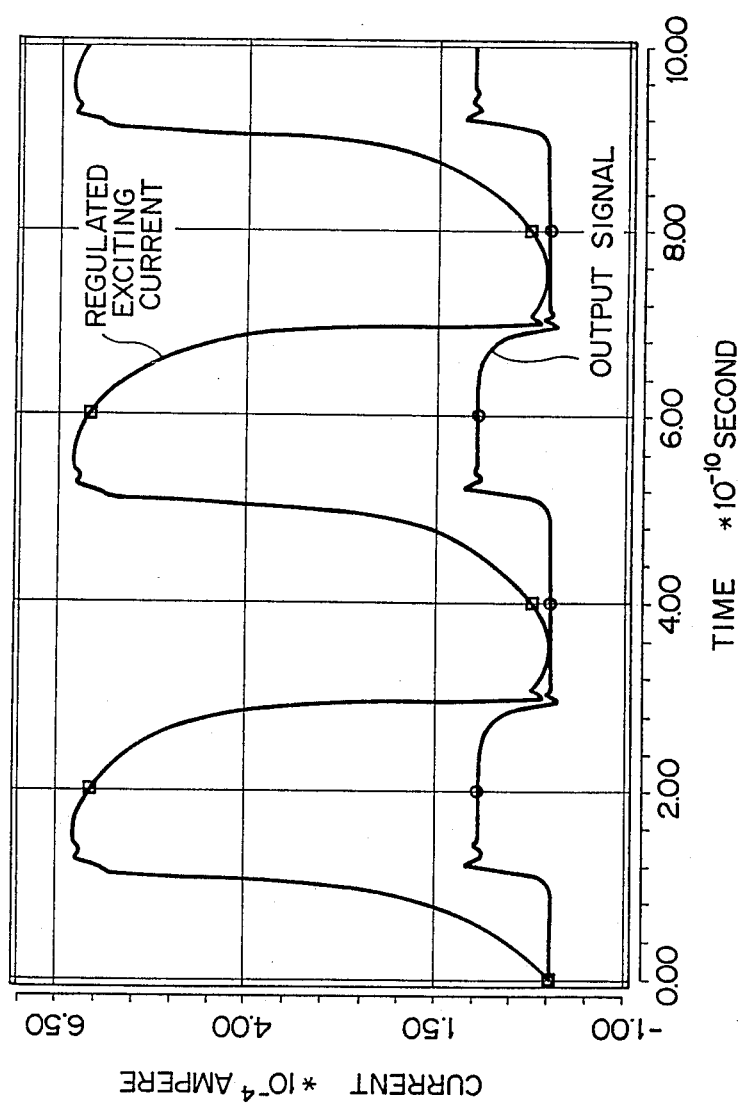
FIG. 23 is a graph showing the relation between the exciting current and the output current when the circuit shown in FIG. 8 is excited by unipolar current.

FIG. 21 shows a fourth example of this invention. In the example of FIG. 21, the $\pi$ phase regulators are constructed with the inductors 12' and 13' on the side of the exciting line 20. The exciting inductor 12' is connected in parallel with the series connection of a Josephson device 100d and a constant phase generator 102d, and the exciting inductor 13' is connected in parallel with the series connection of the Josephson device 100d' and a constant phase generator 102d', whereby each inductor 12' or 13' has the faculty of the $\pi$ phase regulator. In this construction, the regulation is caused in a similar way as the case of FIG. 19. FIG. 22 shows an example in which damping resistors 110d, 110d', 200 and 201 are inserted to damp the resonance of the circuit shown in FIG. 21.

While there have been described what are believed to be the preferred embodiments of the present invention, those skilled in the art will recognize that other and further modifications may be made thereto without departing from the spirit of the invention, and it is intended to claim all such changes and modifications as fall within the true scope of the invention.

What is claimed is:

1. A quantum flux parametron-type superconducting circuit comprising a superconducting loop including two Josephson devices and two exciting inductors, a load inductor connected to the superconducting loop and other inductors magnetically coupled with said exciting inductors, said circuit including a path with a Josephson device which is connected in parallel with said exciting inductors or said other inductors.

2. The superconducting circuit set forth in the claim 1, in which said path is constructed by connecting a Josephson device in parallel with the series connection of said exciting inductors.

3. The superconducting circuit set forth in the claim 1, in which said path is constructed by connecting a Josephson device in parallel with the series connection of said other inductors.

4. The superconducting circuit set forth in the claim 1, in which said path is constructed by connecting a serial connection of a Josephson device and a constant phase generator in parallel with each of said exciting inductors.

5. The superconducting circuits set forth in the claim 1, in which said path is constructed by connecting a series connection of a Josephson device and a constant phase generator in parallel with each of said other inductors.

6. The superconducting circuit set forth in claim 1, in which resistors are connected in parallel with each of the Josephson devices.

* * * * *